United States Patent [19]

Slatter et al.

[11] Patent Number: 5,218,226
[45] Date of Patent: Jun. 8, 1993

[54] SEMICONDUCTOR DEVICE HAVING HIGH BREAKDOWN VOLTAGE

[75] Inventors: John A. G. Slatter, Crawley Down; Henry E. Brockman, Horley; David C. Yule, Oxted, all of England

[73] Assignee: U.S. Philips Corp., New York, N.Y.

[21] Appl. No.: 833,830

[22] Filed: Feb. 5, 1992

Related U.S. Application Data

[63] Continuation of Ser. No. 603,976, Oct. 23, 1990, abandoned.

[30] Foreign Application Priority Data

Nov. 1, 1989 [GB] United Kingdom ................. 8924557

[51] Int. Cl.$^5$ ..................... H01L 29/06; H01L 29/92; H01L 29/72; H01L 27/10
[52] U.S. Cl. ..................... 257/546; 257/239; 257/495; 257/552; 257/590; 257/653; 257/921
[58] Field of Search ....................... 357/13, 14, 88, 20, 357/29, 23.1, 45, 48; 257/239, 297, 546, 552, 590, 653, 921

[56] References Cited

U.S. PATENT DOCUMENTS 4,003,072  1/1977  Matsushita et al. ............... 357/13
4,424,526  1/1984  Dennard et al. ................... 357/14
4,997,784  3/1991  Thenoz et al. ..................... 357/23.1

Primary Examiner—J. Carroll
Attorney, Agent, or Firm—Steven R. Biren

[57] ABSTRACT

A semiconductor body (100) has a first device region (20) of one conductivity type forming with a second device region (13) of the opposite conductivity type provided adjacent one major surface (11) of the semiconductor body (100) a first pn junction (40) which is reverse-biassed in at least one mode of operation. A floating further region (50) of the opposite conductivity type is provided within the first device region (20) remote from the major surfaces (11 and 12) of the semiconductor body (100) and spaced from the second device region (13) so that, in the one mode, the depletion region of the first pn junction (40) reaches the floating further region (50) before the first pn junction (40) breaks down. The floating further region (50) forms a further pn junction (51) with a highly doped capping region (60) of the one conductivity type which is provided within the first device region (20) between the floating further region (50) and the second device region (13) and spaced from the second device region (13) and which enables a high electric field to exist between the first pn junction (40) and the further floating region (50) with less risk of the device breaking down.

4 Claims, 3 Drawing Sheets

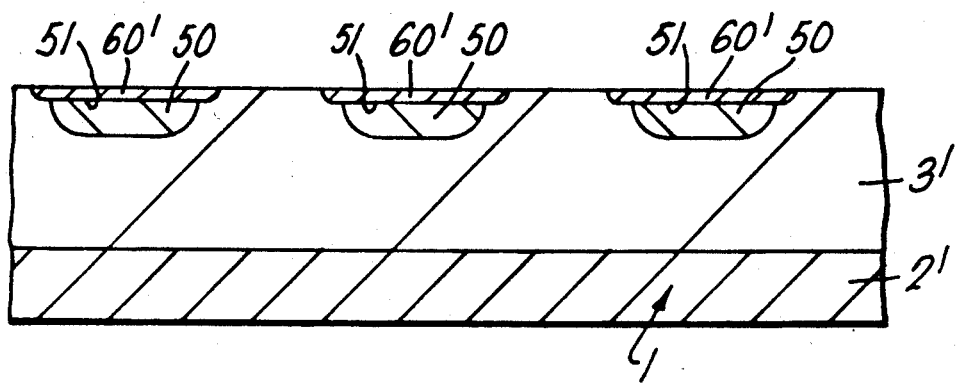
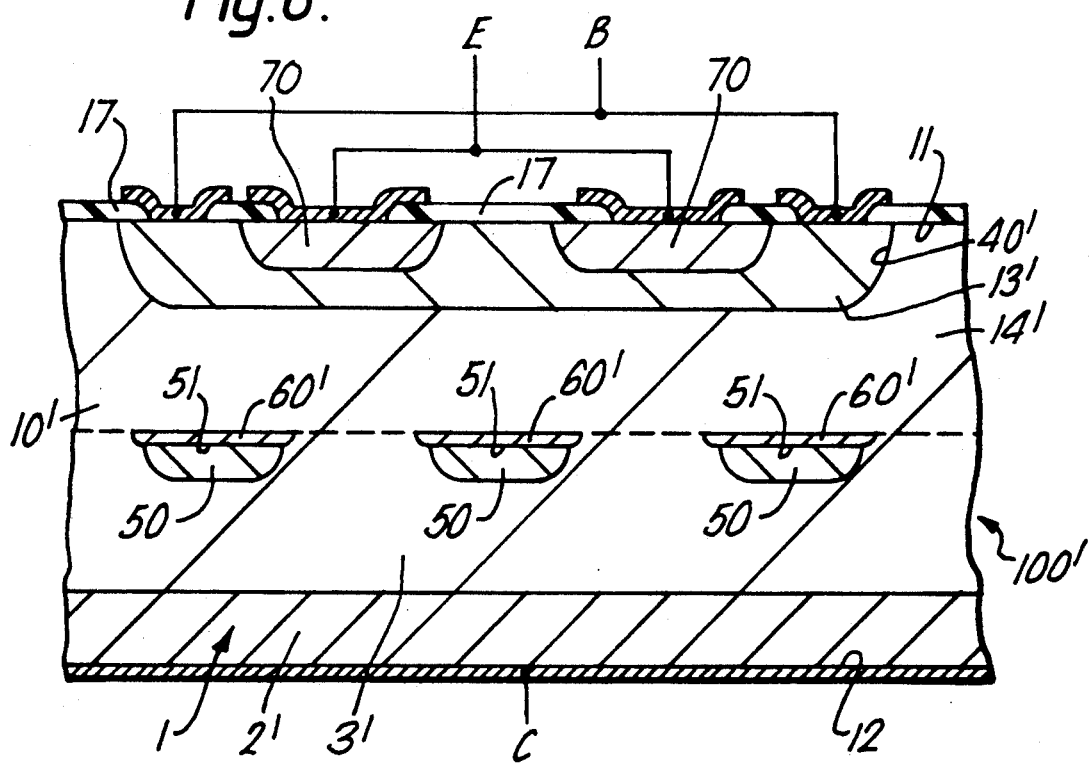

SEMICONDUCTOR DEVICE HAVING HIGH BREAKDOWN VOLTAGE

This is a division of application Ser. No. 603,976, filed Oct. 23, 1990.

BACKGROUND OF THE INVENTION

This invention relates to a semiconductor device and to a method of manufacturing a semiconductor device.

U.S. Pat. No. 4,003,072 describes a semiconductor device comprising a semiconductor body having a first device region of one conductivity type forming with a second device region of the opposite conductivity type provided adjacent one of the major surfaces of the semiconductor body a first pn junction which is reverse-biassed in at least one mode of operation of the device, and a floating further region of the opposite conductivity type provided within the first device region remote from the major surfaces of the semiconductor body and spaced from the second device region so that, in the one mode of operation of the device, the depletion region of the first pn junction reaches the floating further region before the first pn junction breaks down.

Such a device is shown in, for example, FIG. 5 of U.S. Pat. No. 4,003,072 where an array of floating further regions is provided. The floating further regions act to increase the voltage at which the device breaks down when the first pn junction is reverse-biassed in operation of the device. Thus, when under such reverse-biassing conditions the first region is depleted of free charge carriers, the ionized impurity atoms in the further floating regions act to divert electric field lines from the oppositely charged ionized impurity atoms in the first device region. These electric field lines would otherwise serve to increase the field at the first pn junction and help to cause breakdown at the first pn junction. However, because of the tendency of the pn junction(s) between the floating further region(s) and the first device region to become forward-biassed, which reduces the potential between the second device region and the floating region and may cause the potential of the floating region to become fixed, it is difficult for high electric fields to exist above the floating further region(s). This adversely affects the reverse breakdown voltages which can be attained.

SUMMARY OF THE INVENTION

It is an aim of the present invention to provide a semiconductor device and a method of manufacturing such a semiconductor device which overcomes or at least mitigates the above-mentioned problems, enabling even higher breakdown voltages to be achieved.

According to one aspect of the present invention, there is provided a semiconductor device comprising a semiconductor body having a first device region of one conductivity type forming with a second device region of the opposite conductivity type provided adjacent one of the major surfaces of the semiconductor body a first pn junction which is reverse-biassed in at least one mode of operation of the device, and a floating further region of the opposite conductivity type provided within the first device region remote from the major surfaces of the semiconductor body and spaced from the second device region so that, in the one mode of operation of the device, the depletion region of the first pn junction reaches the floating further region before the first pn junction breaks down, characterized in that the further region forms a further pn junction with a highly doped capping region of the one conductivity type provided within the first device region between the floating further region and the second region and spaced from the second region.

In another aspect, the present invention provides a method of manufacturing a semiconductor device, which method comprises providing a first semiconductor body part having a first region of one conductivity type adjacent one surface, providing a further region of the opposite conductivity type adjacent the one surface within the first body part, providing a second semiconductor body part on the one surface to form with the first body part a semiconductor body having opposed major surfaces and to provide a second region of the one conductivity type on the one surface to form with the first region a first device region within which the further region is floating, and providing adjacent one major surface of the semiconductor body a second device region of the opposite conductivity type forming with the first device region a first pn junction which is spaced from the floating further region so that, when the first pn junction is reverse-biassed in at least one mode of operation of the device, the depletion region of the first pn junction reaches the floating further region before the first pn junction breaks down, characterized by providing adjacent the one surface a highly doped region of the one conductivity type which forms a further pn junction with the further region and provides a capping region between the further region and the second device region spaced from the second device region.

Thus, in a semiconductor device embodying the invention, the floating region is capped by a highly doped region of the one conductivity type which enables a high electric field to exist between the first pn junction and the further floating region without the risk (or with less of a risk) of the pn junction formed by the further floating region with the first device region becoming forward-biassed which enables higher breakdown voltages to be achieved for a given resistivity of the semiconductor body.

Normally, if a single floating further region is provided it should be of comparable extent to the first pn junction. However, an array of floating further regions may be provided with each further region forming a further pn junction with a respective highly doped capping region of the one conductivity type provided within the first device region, the floating further regions being equally spaced from the first pn junction and being spaced from one another by a distance sufficient to avoid merging of the depletion regions associated with the further regions under zero bias. The provision of an array of further regions should allow, in comparison to the use of a single floating further region, a larger area for current flow between the major surfaces of the device which should lessen the possibility of current-crowding problems, especially where the semiconductor device is a vertical device with the main current path extending between the major surfaces. The device may be a bipolar transistor, in which case a third device region of the one conductivity type may be provided within the second device region. In the case of a bipolar transistor, the first device region may form at least part of the collector region of the transistor while the second and third device regions form the base and emitter regions, respectively.

In accordance with another aspect of the invention, the additional region(s) may be provided by introducing impurities of the one conductivity type into the one surface of the first semiconductor body part.

The first semiconductor body part may be provided as an epitaxial layer of the one conductivity type on a monocrystalline substrate and the second semiconductor body part may be provided by, after introducing impurities to form the further regions(s) and the associated capping region(s), growing a further epitaxial layer of the one conductivity type on the first body part. Alternatively, the first and second body parts may be manufactured separately as discrete body parts and then joined together by polishing the surfaces of the first and second body parts to be joined to provide optically-flat, activated surfaces, bringing the polished surfaces into contact to establish bonding between the first and second body parts and then subjecting the joined body parts to a heat treatment to strengthen the bond. The use of such a bonding technique enables the first and second semiconductor body parts to be formed of monocrystalline semiconductor body parts to be formed of monocrystalline semiconductor material which can normally be more lowly doped than epitaxially grown material and so should allow higher breakdown voltages to be achieved. Such methods enable the thickness and dopant concentration within the first and second regions to be chosen to achieve the highest possible breakdown voltage while normally maintaining the resistance constant between the major surfaces of the device.

BRIEF DESCRIPTION OF THE DRAWINGS

Embodiments of the invention will now be described, by way of example, with reference to the accompanying drawings, in which:

FIG. 4b is a graph illustrating the change in electrical field E(x) across the device shown in FIG. 4a;

FIGS. 5 and 6 are cross-sectional views of parts of a semiconductor body for illustrating a second method for manufacturing a semiconductor device in accordance with the invention.

It should be understood that the cross-sectional views of FIGS. 1 to 3, 4a, 5 and 6 are not to scale and that certain dimensions, especially the thicknesses of layers, may have been exaggerated in the interests of clarity.

DESCRIPTION OF THE PREFERRED EMBODIMENTS

Figure 3:
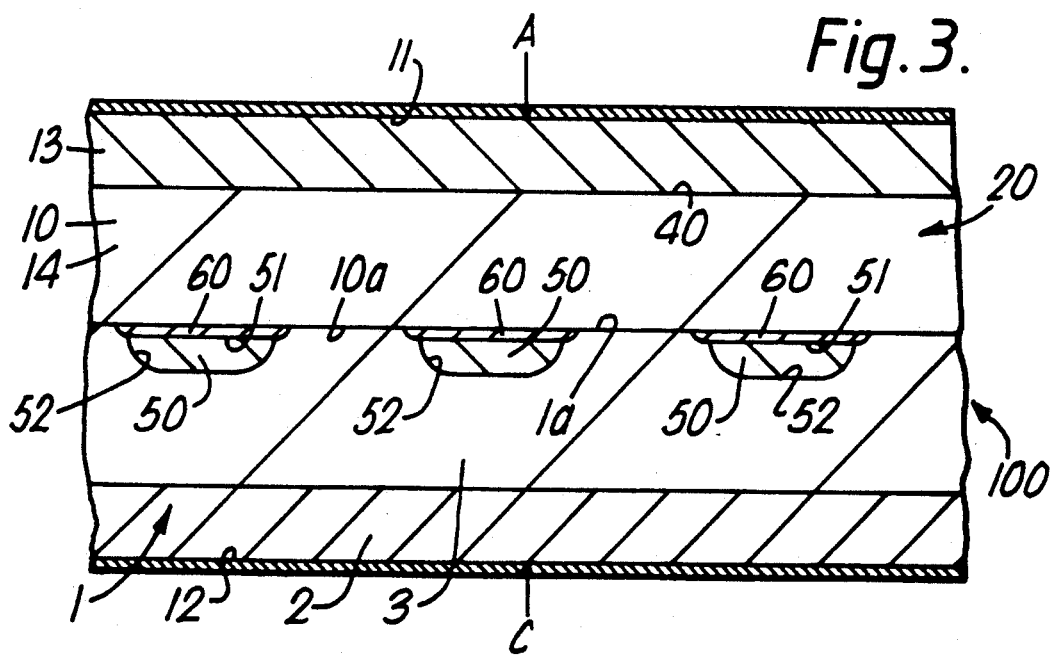

Referring now to the drawings, for example FIG. 3, there is shown a semiconductor device (in the example shown in FIG. 3 a diode) comprising a semiconductor body 100 having a first device region 20 of one conductivity type forming with a second device region 13 of the opposite conductivity type provided adjacent one 11 of the major surfaces 11 and 12 of the semiconductor body 100 a first pn junction 40 which is reverse-biassed in at least one mode of operation of the device, and a floating further region 50 of the opposite conductivity type provided within the first device region 20 remote from the major surfaces 11 and 12 of the semiconductor body 100 and spaced from the second device region 13 so that, in the one mode of operation of the device, the depletion region of the first pn junction 40 reaches the floating further region 50 before the first pn junction 40 breaks down.

In accordance with the invention, the floating further region 50 forms a further pn junction 51 with a highly doped capping region 60 of the one conductivity type provided within the first device region 20 between the floating further region 50 and the second device region 13 and spaced from the second device region 13.

In the examples shown in the drawings, an array of floating further regions 50 is provided with each floating further region 50 forming a further pn junction 51 with a respective highly doped capping region 60. The floating further regions 50 are equally spaced from the first pn junction 40 and are spaced from one another by a distance sufficient to avoid merging of the depletion regions associated with the floating further regions 50 when no bias voltage is applied across the device.

Thus, each floating further region 50 is capped by a highly doped region 60 of the one conductivity type which enables a high electric field to exist between the first pn junction 40 and the further floating region 50 without the risk (or with less of a risk) of the pn junction 52 formed by a further floating region 50 and the first device region 20 becoming forward-biassed, so enabling a higher breakdown voltage to be achieved for a given on-resistance or vice versa. The use of an array of floating further regions 50 and associated capping regions 60 should provide a larger area for current flow between the major surfaces 11 and 12 than would be available if a single floating further region 50 of comparable extent to the first pn junction 40 were used.

Figure 1:
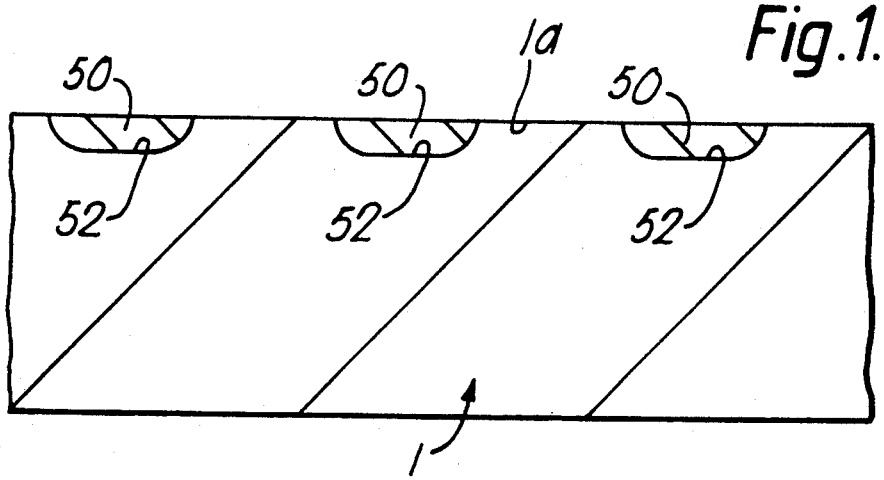
FIGS. 1 to 3 are cross-sectional views of parts of a semiconductor body for illustrating steps in a first method for manufacturing a semiconductor device in accordance with the invention.
Figure 2:
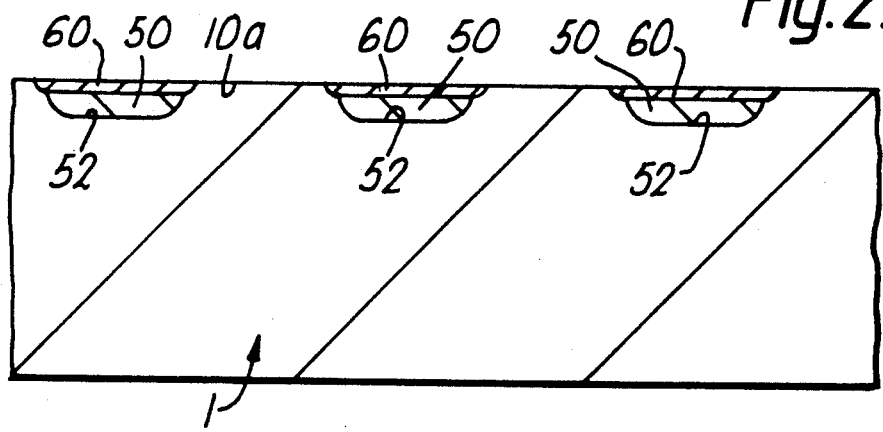

FIGS. 1 to 3 illustrate a first method of manufacturing a semiconductor device, in the example shown a diode, in accordance with the invention.

In this example, the semiconductor body 100 is provided as two separate body parts 1 and 10. The first body part 1 is shown in FIG. 1 and comprises a first monocrystalline silicon body part which is lowly doped with impurities of the one conductivity type, n conductivity type in this example.

A mask (not shown) is provided on the surface 1a of the first semiconductor body part 1 in conventional manner to enable impurities of the opposite conductivity type, in this example p conductivity type, to be introduced, usually by an ion implantation process although a diffusion process could be used, to form the floating further regions 50.

Although only three floating further regions 50 are shown in the Figures, it will be appreciated that the number of floating further regions 50 may be varied depending on the particular device concerned and the desired reverse breakdown voltage. The spacing of the floating further regions 50 may be adjusted as desired provided that the floating further regions 50 are not placed so close together that the depletion regions associated with the floating further regions 50 merge under zero applied bias and not so far apart that the electric field lines are not influenced by the presence of the floating further regions 50. Typically, the floating further regions 50 may be spaced apart by a distance equal or approximately equal to their width, that is the dimension of the further floating regions 50 measured along the surface 1a. It should also be appreciated that in addition to the spacing, the width, depth and doping concentration of the floating further regions 50 may be adjusted to achieve a desired breakdown voltage.

Again, a conventional mask (not shown) is provided on the surface 1a of the first semiconductor body part 1 and impurities of the one conductivity type, n conductivity type in this example, are introduced, usually by an ion implantation process, although a diffusion process could be used, to form the highly doped capping regions 60. The total charge density of the capping regions 60 should be sufficient to stop the electric field lines and will thus be at least $2 \times 10^{12}$ atoms cm$^{-2}$. Preferably, the capping regions 60 are formed to be as thin as practically possible bearing in mind the above constraint. In the present example where the semiconductor body is formed of monocrystalline silicon, then the maximum dopant concentration which can be achieved for n conductivity type dopants is about $10^{21}$ atoms cm$^{-2}$ so that the minimum thickness of the capping region 60 can be about 0.2 $\mu$m. The mask (not shown) is, of course, designed so that each capping region 60 will form a further pn junction 51 with an associated floating further region 50. The capping regions 60 should be formed to be slightly wider than the associated floating further regions 50 so as to ensure that each floating further region 50 is completely covered by the associated capping region 60, and thus masked from the first pn junction 40, despite possible alignment errors which may arise firstly in the positioning of the mask and mask openings.

Another or second semiconductor body part 10 similarly formed of silicon and being lowly doped with impurities of the one conductivity type is then brought into contact with the first semiconductor body part 1 and the surfaces 1a and 10a of the semiconductor body parts 1 and 10 are then joined together by a technique known as 'slice bonding' or 'slice-wringing'. Thus, the surfaces 1a and 10a are first polished to provide optically flat surfaces activated for bonding, that is surfaces having a surface roughness of less than 50 nm and preferably less than 5 nm. In this example, this 'mirror-polishing' is achieved by means of a chemomechanical polishing operation in which use is made, for example, of colloidal silicon dioxide in an alkaline solution with an oxidant such as, for example, the polishing agent marketed under the trade name of Syton W 30 by Monsanto.

The two semiconductor body parts 1 and 10 are then brought into contact with one another in a dust-free environment to establish bonding between the surfaces 1a and 10a. It is believed that the bond formed using this technique may be due to van der Waal's bonding or other dipole bonding and may possibly involve bonding of a chemical or quantum mechanical nature between hydroxyl groups at the surfaces 1a and 10a. The joined semiconductor body parts 1 and 10 are then subjected to a heat treatment, typically by heating the joined body parts 1 and 10 to a temperature of about 900 degrees Celsius for about 30 minutes where first and second semiconductor bodies 1 and 10 are formed of silicon, to increase the adhesion between the semiconductor body parts 1 and 10.

After bonding of the semiconductor body parts 1 and 10, impurities of the one conductivity type are introduced into the other major surface 12 of the semiconductor body 100 to form a highly doped layer 2 to enable ohmic contact to the cathode of the diode. Impurities of the opposite conductivity type, p conductivity type in this example, are introduced into the one major surface 11 of the semiconductor body 100 to provide a relatively highly doped layer of the opposite conductivity type which forms the second device or anode region 13 leaving relatively lowly doped portions 3 and 14 of the first and second semiconductor body parts 1 and 10 to form, with the highly doped contact layer 2, the first device or cathode region of the device. If desired, the thickness of the semiconductor body parts 1 and 10 may be reduced by conventional means prior to forming the highly doped layers 2 and 13. Alternatively, each of the semiconductor body parts 1 and 10 may consist of a highly doped substrate 2,13 onto which a lowly doped epitaxial layer 3,14 is grown.

Anode and cathode electrodes A and C for the semiconductor diode may then be provided in conventional manner, for example by depositing aluminum on the surfaces 11 and 12 of the body 100, to complete the diode.

Although in the example described above, the floating further regions 50 and associated capping regions 60 are formed by introducing impurities, via appropriate masks, into the one surface 1a of the first semiconductor body part 1, it is possible for the floating further regions 50 to be formed by introducing impurities into the one surface 1a of the first semiconductor body part 1 and for the associated capping regions 60 to be formed by introducing impurities into the surface 10a of the second semiconductor body part 10 so that the pn junctions 51 between the floating further regions 50 and associated capping regions 60 are not formed until after the first and second semiconductor body parts have been joined together. In this case, however, allowance has to be made for possible additional misalignment errors which may arise during bonding.

It will, of course, be appreciated by those skilled in the art that the structure described above, with any appropriate modification of doping and layer thickness, may be used as a basis for other semiconductor devices such as bipolar transistors, thyristors, etc. If desired, the highly doped layer forming the second device region 13 could be replaced by a planar p conductivity type region or regions, forming, for example, the base region of a bipolar transistor or the body (that is the channel-defining) region of a DMOSFET by introducing impurities through a mask into the first device region 20 in conventional manner. An emitter (or source) region may then be formed within the p conductivity type region in conventional manner.

The effect of the provision of the floating further regions 50 and associated capping regions 60 will now be described with reference to FIG. 4a which is a cross-sectional view of the semiconductor device similar to FIG. 3 but with the cross-hatching omitted and FIG. 4b which illustrates graphically the change in the electric field E(x) across the device.

Figure 4A:
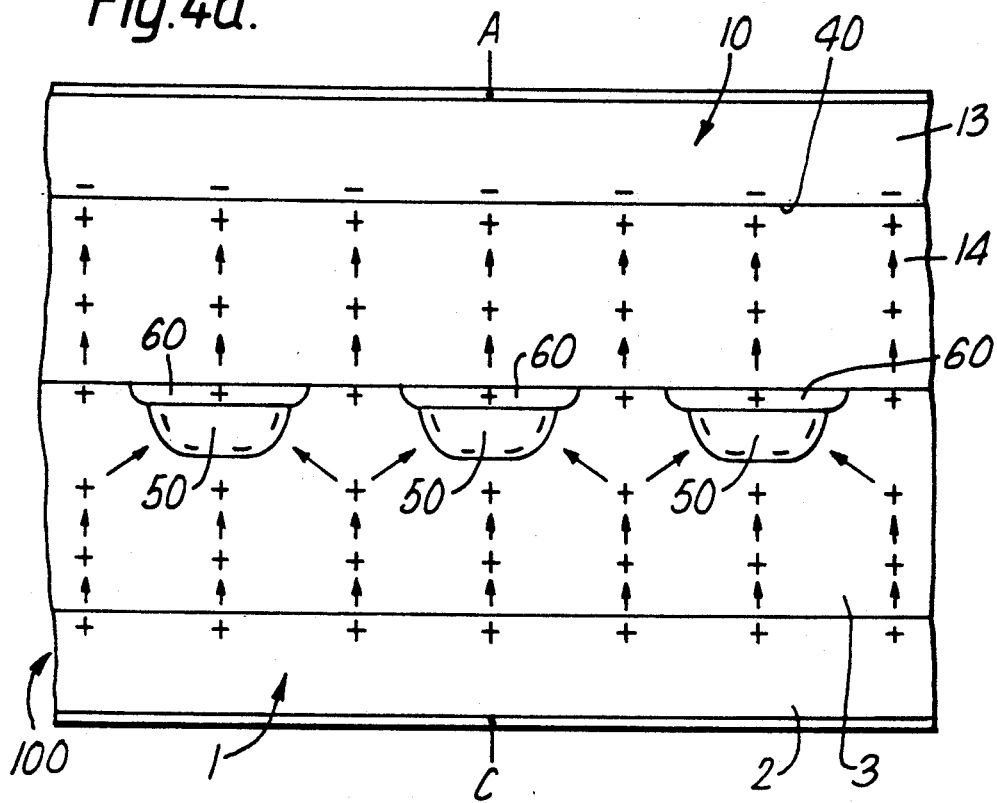
FIG. 4a is a view similar to FIG. 3 but without any cross-hatching for explaining the operation of the device shown in FIG. 3.
Figure 4B:
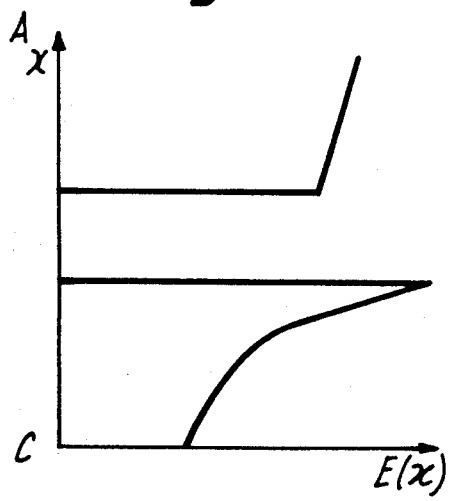

FIG. 4a illustrates schematically by means of the arrows ↑ indicating the field lines and the '+' and '−' signs indicating the positive and negative fixed charges, the electric field within the diode when the diode is reverse-biased and the lowly doped portions 3 and 14 are fully depleted of free charge carriers. As can be clearly seen from FIG. 4a, the presence of the negative fixed charges within the floating further regions 50 serves to divert the field lines and so reduce the value of the peak field at the first pn junction 40 where breakdown would otherwise occur. This reduction in the peak field at the first pn junction 40 is at the expense of an increase in the electric field in the immediate vicinity of the floating further regions 50 between the floating further regions 50 and the first pn junction 40. FIG. 4b illustrates a typical electric field E(x) distribution with distance x across the device from the cathode C to the anode A through the center of a floating further region 50. As shown in FIG. 4b the electric field E(x) reduces to zero within the floating further region 50. The capping regions 60 allow a high field to exist above the floating further regions 50 so that the field does not serve to forward bias the pn junction 52 between the floating further regions 50 and the first device region 20. The capping regions 60 thus act to increase the reverse-breakdown voltage for a given resistance of the lowly doped portions 3 and 14.

The radius of the further floating regions 50 should not be too small as this would otherwise encourage breakdown at a lower reverse voltage. The effect of junction curvature can be alleviated by reducing the spacing between adjacent floating further regions 50. However, as mentioned above, it is important that this separation of adjacent floating further regions 50 is not so small that, at zero bias, the depletion regions merge because this would throttel or pinch-off current flow between the floating further regions 50 at the beginning of conduction in the ON or forward-biassed state. It is thus, as will be appreciated by those skilled in the art, important to adjust the junction curvature and spacing of the floating further regions 50 appropriately for the particular device concerned.

Figure 4C:
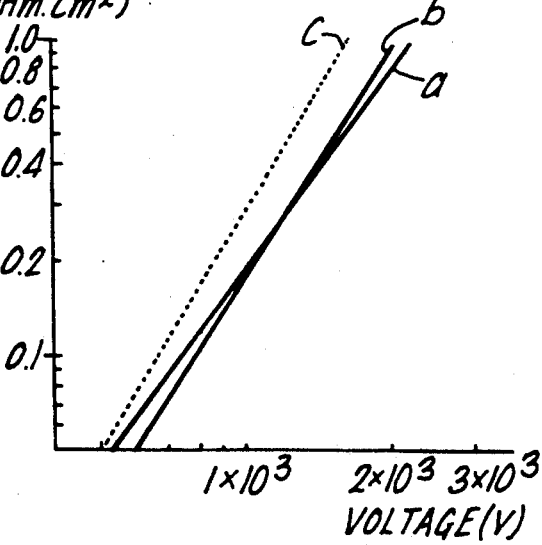
FIG. 4c illustrates graphically calculated achievable breakdown voltages for different resistivities of the semiconductor body for the device shown in FIG. 3 under different conditions.

The thickness and dopant concentration of the lowly doped portions 3 and 14 bounding the floating further regions 50 and associated capping regions 60 may be selected to achieve the highest possible breakdown voltage for a given device structure with the constraint, normally, that the resistance in ohm.cm$^{-2}$ between the highly doped layers 2 and 13 be maintained constant. FIG. 4c illustrates, by means of a graph plotting, both on logarithmic scales, resistance.chip area in ohms.cm$^2$ against reverse breakdown voltage V in volts, the breakdown voltages which can be achieved for a given resistance under various different conditions for the device described above. Thus in FIG. 4c the dotted line c illustrates the situation for a device where the floating further regions 50 (and associated capping regions 60) are not present and so shows the theoretical 'silicon limit' while curve a illustrates the situation where the width Wn between the centers of adjacent floating further regions 50 is 20 $\mu$m, the width Wp of the floating further regions 50 is 15 $\mu$m and the depth ra at the center or deepest point of the floating further regions is 7.5 $\mu$m. In curve b Wn=20 $\mu$m, ra=10 $\mu$m and Wp=10 $\mu$m. As can be seen from FIG. 4c, the presence of the further regions 50 and associated capping regions 60 increases the breakdown voltage for a given resistance.-chip area.

FIGS. 5 and 6 illustrate a second method for manufacturing a semiconductor device in accordance with the invention.

In this example, the first semiconductor body part 1 is provided as a highly doped monocrystalline substrate 2' of the one conductivity type onto which is epitaxially grown a lowly doped layer or portion 3' of the one conductivity type, n conductivity type in this example. After introduction of the impurities to form the floating further regions 50 in a manner similar to that described above, impurities are introduced, using an appropriate conventional mask, to form the capping regions 60' which will be similar in dimensions and dopant concentration to the capping regions 60 shown in FIG. 3.

Then, instead of bringing the first semiconductor body part 1 into contact with a separate second semiconductor body part, the second semiconductor body part is formed by growing a lowly doped epitaxial layer 14' directly onto the one surface 1a of the first semiconductor body part 1.

The semiconductor body 100' may again form an epitaxial diode, in which case a further epitaxial layer of the opposite conductivity type is then grown onto the second epitaxial layer 14' to form the second device region and to complete the semiconductor body 100'. Metallization may then simply be deposited on the surfaces 11 and 12 of the semiconductor body 100' to form the anode and cathode contacts. In this example, however, after completion of the second epitaxial layer 14', p conductivity type impurities are introduced via a mask (not shown) to form a planar base region 13' of a bipolar transistor, the first device region 20 thus forming the collector region of the transistor. In this case, using an appropriate mask, impurities of the one conductivity type are introduced into the second device region 13' to form the emitter region 70 of the bipolar transistor. The emitter region 70 may have any desired known emitter pattern, for example, as shown in FIG. 6, a plurality of emitter fingers may be provided.

An insulating layer 17, for example a layer of silicon dioxide, is then deposited on the surface 11 of the semiconductor body 100' and patterned to define contact openings for the emitter and base metallization. Metallization is then deposited on the surfaces 11 and 12 in conventional manner to form the emitter, base and collector contacts E, B and C, as shown in FIG. 6.

It will be appreciated that the various Figures, being cross-sectional views, do not illustrate the geometry of the devices when viewed in plan, that is when looking towards the surface 11 or 12, and that the floating further regions 50 and associated capping regions 60 may have any desired geometry appropriate for the type and geometry of the device concerned. Thus, the further regions 50 (and associated capping regions 60) may, for example in the case of a semiconductor diode, be provided as, when viewed in plan, annular, circular or rectangular (with rounded corners) regions. Generally, however the floating further regions 50 and associated capping regions 60 will be formed as dots (that is circular cross-section regions) and be arranged in a close-packed array, for example a hexagonal close-packed array.

It should, of course, be understood that the present invention may be applied to other types of semiconductor device, for example vertical MOSFETs, thyristors, diacs, etc. and that it may be used for lateral as well as vertical devices.

The conductivity types given above may be reversed to enable formation of, for example, p channel MOSFETs and pnp bipolar transistors. In addition, the substrate 2 may be of opposite conductivity type to the first epitaxial layer 3 to enable formation of, for example, a thyristor or an insulated gate bipolar transistor. Of course, the present invention may be applied to semiconductor materials other than silicon, for example III-V materials such as gallium arsenide.

From reading the present disclosure, other modifications will be apparent to persons skilled in the art.

We claim:

1. A semiconductor device comprising a semiconductor body having a first device region of one conductivity type forming with a second device region of the opposite conductivity type provided adjacent one of the major surfaces of the semiconductor body a first pn junction which is reverse-biassed in at least one mode of operation of the device, and a floating further region of the opposite conductivity type provided within the first device region remote from the major surfaces of the semiconductor body and spaced from and extending substantially entirely beneath the second device region so that, in the one mode of operation of the device, the depletion region of the first pn junction reaches the floating further region before the first pn junction breaks down, characterized in that the further region forms a further pn junction with a highly-doped capping region of the one conductivity type provided within the first device region between the floating further region and the second device region and spaced from the second device region, and in that an array of floating further regions each forming a further pn junction with a respective highly doped capping region of the one conductivity type is provided within the first device region, with the floating further regions being equally spaced from the first pn junction and being everywhere spaced from one another by a distance sufficient to avoid merging of the depletion regions associated with the further regions under zero bias, the capping regions being everywhere spaced from one another.

2. A semiconductor device according to claim 1, further characterized in that the first device region extends towards the other major surface of the semiconductor body.

3. A semiconductor device according to claim 1, further characterized in that a third device region of the one conductivity type is provided within the second device region.

4. A semiconductor device according to claim 3, further characterized in that the first device region forms at least part of the collector region of a bipolar transistor with the second and third device regions forming the base and emitter regions, respectively.

* * * * *